United States Patent
Good et al.

(10) Patent No.: US 11,836,419 B1
(45) Date of Patent: *Dec. 5, 2023

(54) SYSTEMS AND PROCESSES FOR TRANSFORMATION OF CONSTRUCTION DRAWINGS AND VISUAL TRACKING OF DATA

(71) Applicant: The Estimating Edge LLC, Boynton Beach, FL (US)

(72) Inventors: Nathan Good, Boynton Beach, FL (US); Bassam Saidi, Boynton Beach, FL (US)

(73) Assignee: The Estimating Edge LLC, Boynton Beach, FL (US)

(*) Notice: Subject to any disclaimer, the term of this patent is extended or adjusted under 35 U.S.C. 154(b) by 56 days.

This patent is subject to a terminal disclaimer.

(21) Appl. No.: 17/701,220

(22) Filed: Mar. 22, 2022

Related U.S. Application Data

(63) Continuation of application No. 17/133,248, filed on Dec. 23, 2020, now Pat. No. 11,314,904.

(60) Provisional application No. 62/952,671, filed on Dec. 23, 2019.

(51) Int. Cl.
*G06F 30/12* (2020.01)
*G06F 30/13* (2020.01)

(52) U.S. Cl.
CPC .............. *G06F 30/12* (2020.01); *G06F 30/13* (2020.01)

(58) Field of Classification Search
CPC .......... G06F 30/00; G06F 30/12; G06F 30/13; G06F 2111/02; G06F 2113/16
USPC .............................................................. 703/1
See application file for complete search history.

(56) References Cited

U.S. PATENT DOCUMENTS

| | | | |
|---|---|---|---|
| 6,256,595 B1* | 7/2001 | Schwalb | ................. G06T 19/00 715/252 |
| 7,752,065 B2 | 7/2010 | Buzz | |
| 2004/0019148 A1 | 1/2004 | Suau et al. | |
| 2009/0198539 A1 | 8/2009 | Buzz | |
| 2010/0138762 A1 | 6/2010 | Reghetti | |
| 2013/0218780 A1* | 8/2013 | Buzz | ...................... G06Q 10/06 705/301 |
| 2014/0244338 A1 | 8/2014 | Buzz | |
| 2014/0278267 A1 | 9/2014 | Buzz et al. | |
| 2016/0085418 A1* | 3/2016 | Kling | ................. G06F 3/04842 715/771 |
| 2019/0212991 A1* | 7/2019 | Ye | ........................... G06F 30/00 |
| 2020/0356102 A1 | 11/2020 | Morse | |
| 2021/0055716 A1 | 2/2021 | Turner | |

\* cited by examiner

*Primary Examiner* — Cedric Johnson
(74) *Attorney, Agent, or Firm* — Morris, Manning & Martin, LLP; Daniel E. Sineway, Esq.

(57) ABSTRACT

In various embodiments, the data visualization system imports and displays, on an electronic device (e.g., a tablet, desktop computing device, etc.), a representation of a construction drawing of a project and corresponding one or more shapes. In one or more embodiments, the one or more shapes may represent an area of the construction drawing. In one or more embodiments, the data visualization system may track project completion and assign colors to the one or more shapes indicating work completion for those shapes.

20 Claims, 11 Drawing Sheets

Daily Production

Review the daily production, then click upload to commit the results.    3 Labors | Email | Upload

| Description | Labor Item | Workers | Hours | Total (Hrs) | Selected Qty. | Total Qty. |
|---|---|---|---|---|---|---|
| Mar 11, 2019 at 1:47:12 PM EDT | | | | | | |
| DRYWALL Installation (Low) | Hang 5/8"x10'0" FC to 10'0" | 1 | 1 | 1 | 957.59 SF | 1473.21 SF |
| Mar 11, 2019 at 1:30:52 PM EDT | | | | | | |
| DRYWALL Installation (High) | Hang 5/8"x8'0" FC to (10'0" to 14'0") | 1 | 0.26 | 0.26 | 37.19 SF | 106.26 SF |
| Mar 11, 2019 at 1:30:51 PM EDT | | | | | | |
| DRYWALL Installation (High) | Hang 5/8"x8'0" FC to (10'0" to 14'0") | 1 | 0.74 | 0.74 | 105.14 SF | 300.4 SF |

SYSTEMS AND PROCESSES FOR TRANSFORMATION OF CONSTRUCTION DRAWINGS AND VISUAL TRACKING OF DATA

CROSS REFERENCE TO RELATED APPLICATIONS

This application is a continuation of U.S. patent application Ser. No. 17/133,248, entitled "SYSTEMS AND PROCESSES FOR TRANSFORMATION OF CONSTRUCTION DRAWINGS AND VISUAL TRACKING OF DATA," filed Dec. 23, 2020, which claims the benefit of, and priority to, U.S. Provisional Patent Application. No. 62/952,671, filed on Dec. 23, 2019, and entitled "SYSTEMS AND METHODS FOR TRANSFORMATION OF CONSTRUCTION DRAWINGS AND VISUAL TRACKING OF DATA," each of which are hereby incorporated by reference herein as if set forth in their entireties.

BACKGROUND

Electronic construction drawing files tend to very large (many megabytes or gigabytes). Thus, it is challenging to review, annotate, and track data related to electronic construction drawings without powerful computing devices. This can be especially challenging at a construction site, where a mobile or light-weight computing device and format (e.g., at a construction site or the like) is advantageous.

Further, previous systems and methods for tracking project data (e.g., for example labor and labor completion data) during construction or other similar projects may not allow for precise and accurate tracking of project completion throughout the project lifecycle, because of issues regarding recording and standardization of project completion data. The inability to precisely and accurately track project completion across one or more subunits reduces labor efficiency and inhibits contractor's ability to produce accurate estimates of labor cost.

Therefore, there is a long-felt but unresolved need for a system or process that transforms construction drawings and visually tracks data throughout a project lifecycle.

BRIEF SUMMARY OF THE DISCLOSURE

The present systems and processes relate generally to transforming construction drawings and visually tracking data throughout a project lifecycle. In various embodiments, the present systems and processes address input and standardization issues by increasing precision and accuracy of project completion tracking. According to particular embodiments, the present systems and processes may be referred to collectively as an electronic labor data visualization system or "the data visualization system", wherein the data visualization system may precisely and accurately track completion data across one or more task zones (e.g., "shapes") present in one or more construction drawings and/or portions of construction drawings of a project.

In various embodiments, the data visualization system reduces project completion tracking issues of previous systems and processes by incorporating novel methods and elements, which, in part, standardize completion data recording across one or more shapes (e.g., task areas) contained in one or more construction drawings of a project. In one or more embodiments, the data visualization system may produce one or more project completion visualizations (e.g., on an electronic device) including one or more shapes and one or more construction drawings. In at least one embodiment, the one or more visualizations may further include, but are not limited to: 1) project labor completion data, such as times and physical measurements; 2) one or more specific layer assignments; 3) one or more specific coloring assignments corresponding to project completion data; and 4) one or more photos and/or images.

In various embodiments, the data visualization system may detect and track manipulations and/or interactions with the one or more visualizations produced by the data visualization system to assess project completion and update project completion data. In one or more embodiments, the data visualization system may update project data and the one or more project completion visualizations based on the updated project completion data. In at least one embodiment, the one or more project visualizations and other project data may be uploaded, via an application programming interface ("API"), by the data visualization system to a storage database (e.g., located in a cloud environment or a physical environment), wherein the uploaded visualizations and data may be accessible to the user through the API and a corresponding web portal. In one embodiment, the API may be included in and be defined by the system. In one or more embodiments, project visualizations and other project data may be formatted in a JavaScript™ Object Notation (JSON) format (e.g., for transmission and/or processing purposes). In at least one embodiment, uploaded projected visualizations and other project data may be received as one or more JSON payloads. In one or more embodiments, shapes may be transferred into and/or from the data visualization system as a collection of points and/or coordinates. In at least one embodiment, after being transferred into the data visualization system, the collection of points and/or coordinates may be rendered using a coordinate system. In one embodiment, shapes may be defined (e.g., drawn, input, etc.) using the data visualization system and/or one or more systems operatively connected to the data visualization system, and shape definitions (e.g., consisting of a collection of points, such as, for example, coordinates) may include both shape dimensions and shape metadata (e.g., for example, associated labor, tasks, materials, and other project information).

According to a first aspect, a process for data visualization including: receiving a JSON package including: a CAD drawing in an image format: at least one shape and x-y coordinate data associated with a particular location of the at least one shape on the CAD drawing; metadata associated with the at least one shape corresponding to one or more properties of the at least one shape; rendering the CAD drawing image on a display screen; rendering the at least one shape at the particular location on the CAD drawing image based at least in part on the x-y coordinate data in a particular color; and in response to receiving an indication of work completed associated with the one or more properties of at least one shape, modifying the particular color of a portion of the at least one shape on the display screen.

According to a second aspect, the process of the first aspect or any other aspect, wherein the particular color is associated with a first layer.

According to a third aspect, the process of the second aspect or any other aspect, wherein the at least one shape is associated with a first layer of the CAD drawing.

According to a fourth aspect, the process of the third aspect or any other aspect, wherein the JSON package includes a second shape associated with a second layer.

According to a fifth aspect, the process of the fourth aspect or any other aspect, wherein the process further includes rendering the second shape on the display screen.

According to a sixth aspect, the process of the fifth aspect or any other aspect, wherein rendering the second shape on the display screen includes rendering the second shape in a second location on the CAD drawing image based at least in part on second x-y coordinate data.

According to a seventh aspect, the process of the sixth aspect or any other aspect, wherein the second location on the CAD drawing is the particular location.

According to an eighth aspect, the process of the seventh aspect or any other aspect, wherein the process further includes rendering the at least one shape and the second shape in a second color.

According to a ninth aspect, the process of the eighth aspect or any other aspect, wherein the second color is not the particular color.

According to a tenth aspect, the process of the sixth aspect or any other aspect, wherein the second location on the CAD drawing is different than the particular location.

According to an eleventh aspect, the process of the tenth aspect or any other aspect, wherein the process further includes rendering the at least one shape in the particular color and the second shape in a second color.

According to a twelfth aspect, the process of the first aspect or any other aspect, wherein the process further includes receiving a selection of the CAD drawing.

According to a thirteenth aspect, the process of the first aspect or any other aspect, wherein the one or more properties of the at least one shape include an amount of materials.

According to a fourteenth aspect, a system for data visualization including: at least one processor in operative communication with one or more servers, the at least one processor configured for: receiving a JSON package from the one or more servers, the JSON package including: a CAD drawing in an image format: at least one shape and x-y coordinate data associated with a particular location of the at least one shape one the CAD drawing; metadata associated with the at least one shape corresponding to one or more properties of the at least one shape; rendering the CAD drawing image on a display screen; rendering the at least one shape at the particular location on the CAD drawing image based at least in part on the x-y coordinate data in a particular color; and in response to receiving an indication of work completed associated with the one or more properties of at least one shape, modifying the particular color of a portion of the at least one shape on the display screen.

According to a fifteenth aspect, the system of the fourteenth aspect or any other aspect, wherein the particular color is associated with a first layer.

According to a sixteenth aspect, the system of the fifteenth aspect or any other aspect, wherein the at least one shape is associated with a first layer of the CAD drawing.

According to a seventeenth aspect, the system of the sixteenth aspect or any other aspect, wherein the JSON package includes a second shape associated with a second layer.

According to an eighteenth aspect, the system of the seventeenth aspect or any other aspect, wherein the process further includes rendering the second shape on the display screen.

According to a nineteenth aspect, the system of the eighteenth aspect or any other aspect, wherein rendering the second shape on the display screen includes rendering the second shape in a second location on the CAD drawing image based at least in part on second x-y coordinate data.

According to a twentieth aspect, the system of the nineteenth aspect or any other aspect, wherein the second location on the CAD drawing is the particular location.

According to a twenty-first aspect, the system of the twentieth aspect or any other aspect, wherein the process further includes rendering the at least one shape and the second shape in a second color.

According to a twenty-second aspect, the system of the twenty-first aspect or any other aspect, wherein the second color is not the particular color.

According to a twenty-third aspect, the system of the nineteenth aspect or any other aspect, wherein the second location on the CAD drawing is different than the particular location.

According to a twenty-fourth aspect, the system of the twenty-third aspect or any other aspect, wherein the process further includes rendering the at least one shape in the particular color and the second shape in a second color.

According to a twenty-fifth aspect, the system of the fourteenth aspect or any other aspect, wherein the process further includes receiving a selection of the CAD

DRAWING

According to a twenty-sixth aspect, the system of the fourteenth aspect or any other aspect, wherein the one or more properties of the at least one shape include an amount of materials.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE FIGURES

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein:

FIG. 5 illustrates an exemplary daily production report on a user interface, according to one embodiment of the present disclosure;

FIG. 6 illustrates an exemplary pop-up window for selecting report types on a user interface, according to one embodiment of the present disclosure;

FIG. 9 illustrates an exemplary construction drawing selection page on a user interface, according to one embodiment of the present disclosure;

DETAILED DESCRIPTION

Figure 1:
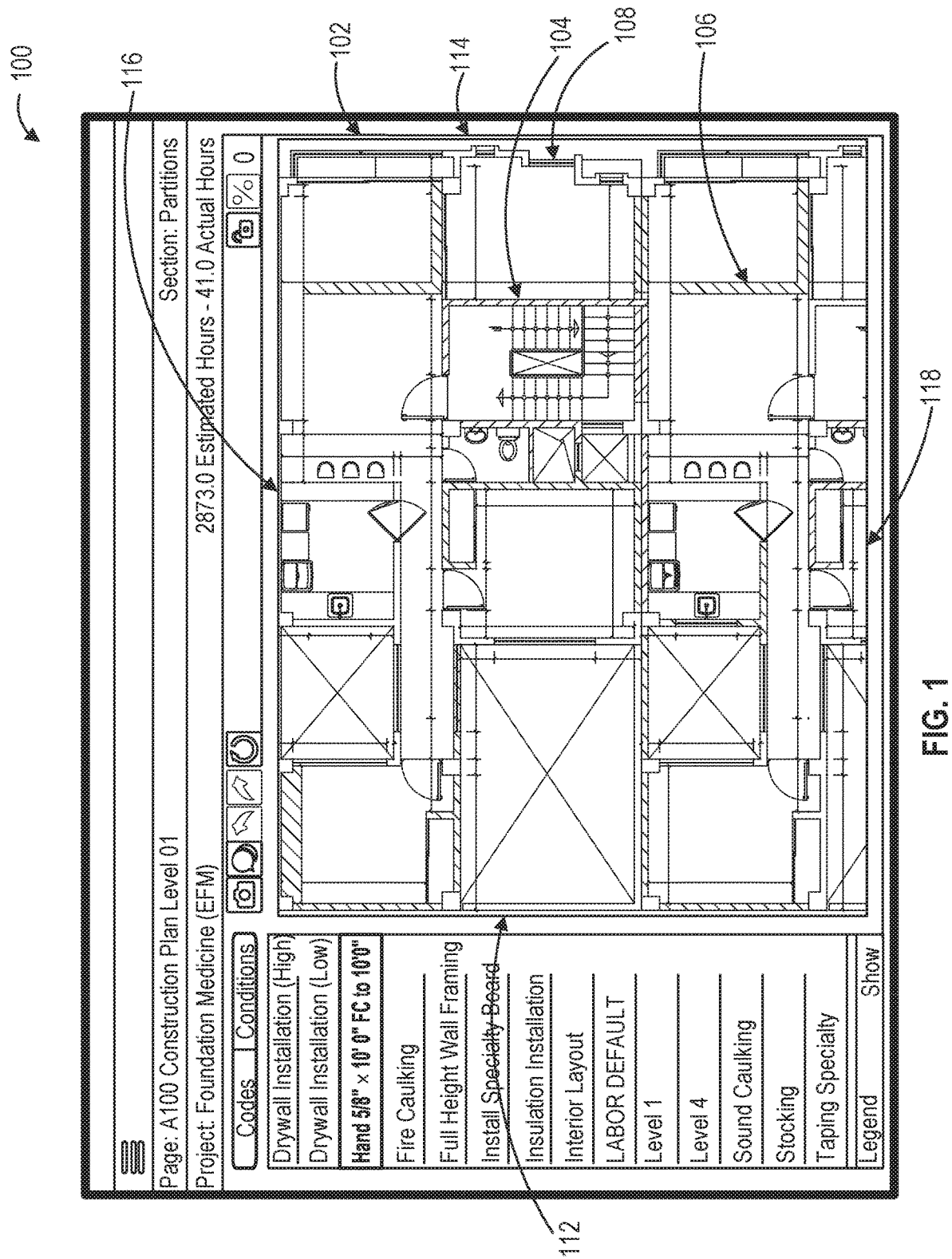
FIG. 1 illustrates an exemplary construction drawing on a user interface, according to one embodiment of the present disclosure.

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Whether a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended. However, the capitalization or lack thereof within the remainder of this document is not intended to be necessarily limiting unless the context clearly indicates that such limitation is intended.

Overview

In various embodiments, the data visualization system imports and displays, on an electronic device (e.g., a tablet, desktop computing device, etc.), a construction drawing or the like, of a project and a corresponding one or more shapes, wherein the construction drawing and the one or more shapes may represent an area of the construction drawing or a particular part or component, such as a pipe, portion of electrical wiring, portion of drywall, etc. In some embodiments, the construction drawing, the one or more shapes and associations between the one or more shapes and the construction drawing may be imported from one or more data sources and/or one or more other systems. Thus, in one embodiment, the associations may be pre-defined. In various embodiments, the associations may be defined automatically by the data visualization system and/or one or more systems operatively connected thereto. For example, a system (e.g., the tracking or a connected system) may receive imported data defining an association between an area of a construction drawing and a shape containing the area of the construction drawing. In one embodiment, the system may also assign and/or embed information (e.g., such as labor, materials, and/or other project information) into the construction drawing and/or shape (e.g., as metadata). In the same example, the construction drawing may be an image (e.g., of a blueprint) and the shape may be an image placed on top of the construction drawing image. In at least one embodiment, the construction drawing may be selected from a set of construction drawings, wherein the set of construction drawings is displayed by the data visualization system as a carousel including one or more construction drawings (e.g., pertaining to the project).

In one or more embodiments, each shape of the one or more shapes may include assignments to one or more layers, wherein each of the one or more layers may be associated with a labor code (e.g., an actionable project task). In some embodiments, each shape of the one or more shapes may be assigned a specific color. In at least one embodiment, the specific color of each of the one or more shapes within the one or more shapes may correspond with a specific layer and/or a specific number of the one or more layers to which each of the one or more shapes has been assigned. In many embodiments, each shape of the one or more shapes may be at least partially defined by a user prior to being received by the data visualization system. According to particular embodiments, the user may define material properties (e.g., LF of drywall to hang, length of pipe to install) and/or amount of labor (e.g., number of hours, number of workers, etc.) to install a length of pipe, drywall, or other component or part represented by a shape. In at least one embodiment, a user may define a location of the one or more shapes, which may be translated to x-y coordinate information and shape positioning/orientation information. For example, in one embodiment, a user may utilize one or more systems operatively connected to the data visualization system to digitally draw a shape on a blueprint, the metadata from which the one or more systems may associate with the shape (e.g., the location and/or x-y coordinate information and shape orientation). Continuing with the example, upon receiving a data package including shape information, the data visualization system may recognize the metadata as location information data for placing the shapes onto the construction drawing (e.g., the data visualization system places the shapes onto the construction drawing as the user had previously drawn in the one or more systems operatively connected to the data visualization system). In another embodiment, the shapes may be defined by information included in a CAD drawing (e.g., BIM information), opposed to user defined information, that is received by the data visualization system, which includes shape location information, positioning/orientation information, labor information (number of hours or workers), quantity of materials, etc.

For example, a construction drawing of a floor of a building may include various components, parts, and structures to be built or otherwise worked on by one or more groups (e.g., subcontractors, electricians, plumbers, etc.), each of these components, parts, and/or structures referred to as "shapes." Continuing with this example, each of the shapes to be built or otherwise worked on by a different group may be included in a different "layer" of the construction drawing (e.g., a different group). Prior to more recent advancements in CAD technologies, components, parts, and/or structures for each specialty or group would be included on separate, transparent drawing layers (typically made of Mylar or like material). Each layer could be laid on top of a general drawing of the floor plan to get a complete visual of all of the various components, parts, or structures that needed to be completed to complete building the floor. Likewise, different layers could be removed so others could more easily be seen (e.g., a drywall layer could be removed so a plumbing layer could be more easily seen). Current technologies allow these different physical layers to be created electronically (e.g., in CAD programs or the like).

In various embodiments, one or more shapes assigned to a single layer (e.g., a drywall, plumbing, electrical, or other layer) may be assigned a distinct color (e.g., light blue). In at least one embodiment, one or more shapes sharing identical coordinates, but on separate layers (e.g., on the construction drawing such as an electrical wire and piping that are vertically separated, but appear on top of each other in a two-dimensional drawing) may be considered multi-layered and displayed in a distinct color when both layers are displayed (e.g., navy blue). In some embodiments, one or more shapes may be assigned more than one layer and may be assigned a different distinct color (e.g., green).

Exemplary Embodiments

Referring now to the figures, for the purposes of example and explanation of the fundamental processes and components of the disclosed systems and methods, reference is made to FIG. 1, which illustrates an exemplary, high-level overview 100 of one embodiment of the data visualization system. As will be understood and appreciated, the exemplary, high-level overview 100 shown in FIG. 1 represents merely one approach or embodiment of the present system, and other aspects are used according to various embodiments of the present system.

FIG. 1 shows an exemplary construction drawing on a user interface of the data visualization system, according to one embodiment of the present disclosure. In multiple embodiments, a construction drawing 102 may be an image of a blue print or architectural plan (or other similar project plan) utilized to track project completion for the data visualization system. In one or more embodiments, the construction drawing 102 may include one or more shapes, for example, shape 104, shape 106, and shape 108, which are overlaid onto the construction drawing 102. In some embodiments, each shape of the one or more shapes is an area of the construction drawing 102 representing a portion of the construction drawing 102 (e.g., a sink, a section of wall, etc.). For example, in one embodiment, a construction drawing 102 may include a particular section of drywall having particular dimensions, which the data visualization system overlays a shape on the construction drawing 102 over the area containing the particular section of drywall. In many embodiments, a user may interact with the one or more shapes when manipulating the user interface of the system, rather than the underlying construction drawing 102.

In various embodiments, the data visualization system imports and displays, on an electronic or computing device (e.g., a tablet, laptop, mobile device, etc.), the construction drawing 102 of a project and the corresponding one or more shapes. In one or more embodiments, the data visualization system may receive an electronic file or data package (or packages) from a third-party system (e.g., a project estimation system). In at least one embodiment, the electronic file may include or be a JSON package, or some similar package. In one embodiment, the JSON package may include data or a file representing or associated with a CAD file. In many embodiments, the JSON package may include an image file of a converted CAD file (e.g., converted into an image file, which may show construction drawing 102).

In some embodiments, the data visualization system may display the construction drawing 102 on the user interface of an electronic device (e.g., personal computer, tablet, mobile device, etc.). In one or more embodiments, the construction drawing 102 is displayed in a two-dimensional format on the display screen electronic device. In at least one embodiment, the construction drawing 102 may be manipulated by a user via the user interface. In one embodiment, such manipulations may include, but are not limited to, panning across the construction drawing 102, magnifying the construction drawing 102, etc.

In several embodiments, the electronic file or data package may include data or information defining the one or more shapes. In one or more embodiments, the one or more shapes may be digital representations of areas of the construction drawing 102. In many embodiments, because the construction drawing 102 is an image or some similar file, the data visualization system overlays the one or more shapes onto the construction drawing 102 so that a user may select each of the one or more shapes for inputting work completion information.

In some embodiments, the data visualization system imports or receives data associated with the one or more shapes. In at least one embodiment, the data associated with the one or more shapes includes location information (e.g., x-y coordinate information or information that the system can convert into an x-y coordinate system) such that the system may place each shape of the one or more shapes onto a position on the construction drawing 102. In one or more embodiments, because the construction drawing 102 is displayed in two-dimensions, the system may place each shape onto the construction drawing 102 based on the x-y coordinate information. In many embodiments, the data package may also include related to the orientation and/or boundary location information for each shape, or include corner or line information, such that each shape of the one or more shapes is positioned in the correct area on the (image-converted) construction drawing 102. For example, in one embodiment, a particular section of drywall may be a rectangular shape having a particular length and particular width on the construction drawing 102 (e.g., blueprint representation). Continuing with this example, in one or more embodiments, the shape corresponding to the particular section of drywall may be associated with metadata that includes x-y coordinate information, information associated with or defining outer boundaries of the rectangle, and/or information defining all portions inside the rectangle.

For example, in one embodiment, a construction drawing 102 may have a left edge 112, a right edge 114, a top edge 116, and a bottom edge 118, such that the junction at the left edge 112 and top edge 116 may be defined as the x-y coordinate point '0,0'. Continuing with the example, in some embodiments, the left edge 112 and right edge 114 (e.g., the y-axis to the x-y coordinate system) may be a particular height, and the top edge 116 and bottom edge 118 (e.g., the x-axis to the x-y coordinate system) may be a particular length, such that each point within the construction drawing 102 may have a defined x-y coordinate. Still continuing with the example, in many embodiments, the shape 106 may be associated with x-y coordinate information such that the shape 106 overlays a wall on the construction drawing 102. In at least one embodiment, the x-y coordinate information for shape 106 may include each point within the shape (e.g., all points within the "L" area of the wall), and/or may include perimeter information, such that the system may determine the perimeter of the shape 106 and determine each point therein. In various embodiments, the system may set up the x-y coordinate system so that point '0,0' is at any point on the construction drawing 102 (e.g., the center point of the construction drawing 102, etc.). In additional embodiments, the system may define the junction at the left edge 112 and the bottom edge 116 as the x-y coordinate point '0,0', the junction at the right edge 114 and the bottom edge 116 as the x-y coordinate point '0,0', or the junction at the right edge 114 and the top edge 118 as the x-y coordinate point '0,0'.

In some embodiments, the data visualization system also imports or receives data indicating or including associations between the construction drawing 102 and the one or more shapes. In many embodiments, the construction drawing 102, the one or more shapes and data associations between the one or more shapes and the construction drawing 102 may be imported from one or more data sources and/or one or more other systems. For example, in one embodiment, a system (e.g., the data visualization system or a connected system) may receive imported data from one or more data sources defining an association between an area of a construction drawing 102 and one or more shapes containing the area of the construction drawing. In the same example, the construction drawing 102 may be an image (e.g., of a blueprint) and the one or more shapes may be one or more images displayed on top of the construction drawing image. In at least one embodiment, the data associations and metadata may be stored in tables on a server or on a computing device.

In some embodiments, the data associated with the one or more shapes may include metadata that defines the labor, materials, cost, etc. for each shape. For example, in one embodiment, for a particular shape that represents a piece of drywall in a construction drawing 102, data for the particular shape may include location information, a labor code/layer information, material information (e.g., material needed to construct the particular shape and how much material needed), labor information (e.g., how many workers needed to perform work related to constructing the particular shape, and the estimated amount of time the work should take), cost information (e.g., costs associated with the material and labor), and other similar information.

In at least one embodiment, after importing or receiving data associated with one or shapes, the system may assign and/or embed the data or metadata (e.g., such as labor, materials, and/or other project information) into the construction drawing 102 and/or one or more shapes. In one or more embodiments, the data visualization system may automatically import data indicating associations between shapes and a construction drawing upon commencement of a project, which may be communicated to the system via receipt of an "activation" command, or the like.

In multiple embodiments, data for each shape of the one or more shapes may include assignments to one or more layers, wherein each of the one or more layers may be associated with a labor code (e.g., an actionable project task). In at least one embodiment, each shape of the one or more shapes may be assigned a specific color (color assignment may be included in data received by the system or may be assigned by the system based on layer). In at least one embodiment, the specific color of each of the one or more shapes within the one or more shapes may correspond with a specific layer and/or a specific number of the one or more layers to which each of the one or more shapes has been assigned.

In various embodiments, each shape of the one or more shapes assigned to a single layer may be assigned a distinct color (e.g., light blue) and/or pattern (e.g., hatching) denoted by shape 104 and shape 106 (e.g., shape 104 may be included on a distinct layer and shape 106 is included on a separate, distinct layer—shown by hatching in different directions) in FIG. 1. As utilized in FIG. 1, the different hatching for different shapes may be associated with different colors for the shapes (e.g., the hatching utilized on the shapes in FIG. 1 may represent hatching or may represent different colors). In at least one embodiment, two or more particular shapes of the one or more shapes sharing identical coordinates (e.g., on the construction drawing) may be considered multi-layered, denoted by shape 108 (e.g., shape 108 may include two or more particular shapes that share identical coordinates). For example, in one embodiment, a first particular shape associated with a wall and a second particular shape associated with a water pipe may share identical coordinates (e.g., the water pipe inside the wall). Continuing with the example, in many embodiments, the first particular shape associated with the wall may be associated with a first particular layer (and therefore, a first particular labor code), and the second particular shape associated with the water pipe may be associated with a second particular layer, but because the construction drawing 102 on the display screen is two-dimensional, the system may assign the first particular shape and the second particular shape a color different from each shape's layer color to visually denote that the shapes are multi-layered (e.g., visually stacked on top of one another in two-dimensions).

In multiple embodiments, each shape of the one or more shapes assigned to a single layer may be assigned a distinct pattern or other type of distinguishing feature (e.g., hatching).

In several embodiments, the data visualization system may render a labor code list 106 on the display screen of the user interface that allows a user to view each labor code associated with the one or more shapes for a particular construction drawing 102 (e.g., as a particular layer). In many embodiments, the user may select one or more labor codes 108 from the labor code list 106 (e.g., by pressing or tapping one or more labor codes). In one or more embodiments, the system may detect the selection of one or more labor codes 108, and display only the particular shapes associated with the selected one or more labor codes 108 on the construction drawing 102. In one embodiment, if the system is displaying the particular shapes associated with one or more particular labor codes such that none of the displayed particular shapes have identical coordinates, the system may render each of the particular shapes in one or more particular colors, such that each of the particular one or more labor codes is associated with a particular color (e.g., even if the a displayed particular shape shares identical coordinates with an undisplayed shape).

As will be understood from discussions herein, the system may display one or more shapes in any suitable way that might be useful for organizing visual information for a user. In various embodiments, if the system is displaying the particular shapes associated with one or more particular labor codes such that none of the displayed particular shapes have identical coordinates, but the displayed particular shapes share identical coordinates with undisplayed shapes (associated with unselected labor codes), the displayed particular shapes having identical coordinates with undisplayed shapes may be assigned the color associated with multi-layering (e.g., navy blue), rather than the particular color assigned to the particular shapes associated with the particular labor code (e.g., orange). In further embodiments, the system may display one or more shapes with color corresponding to like shapes, even if associated with a different labor code/layer.

Figure 2:
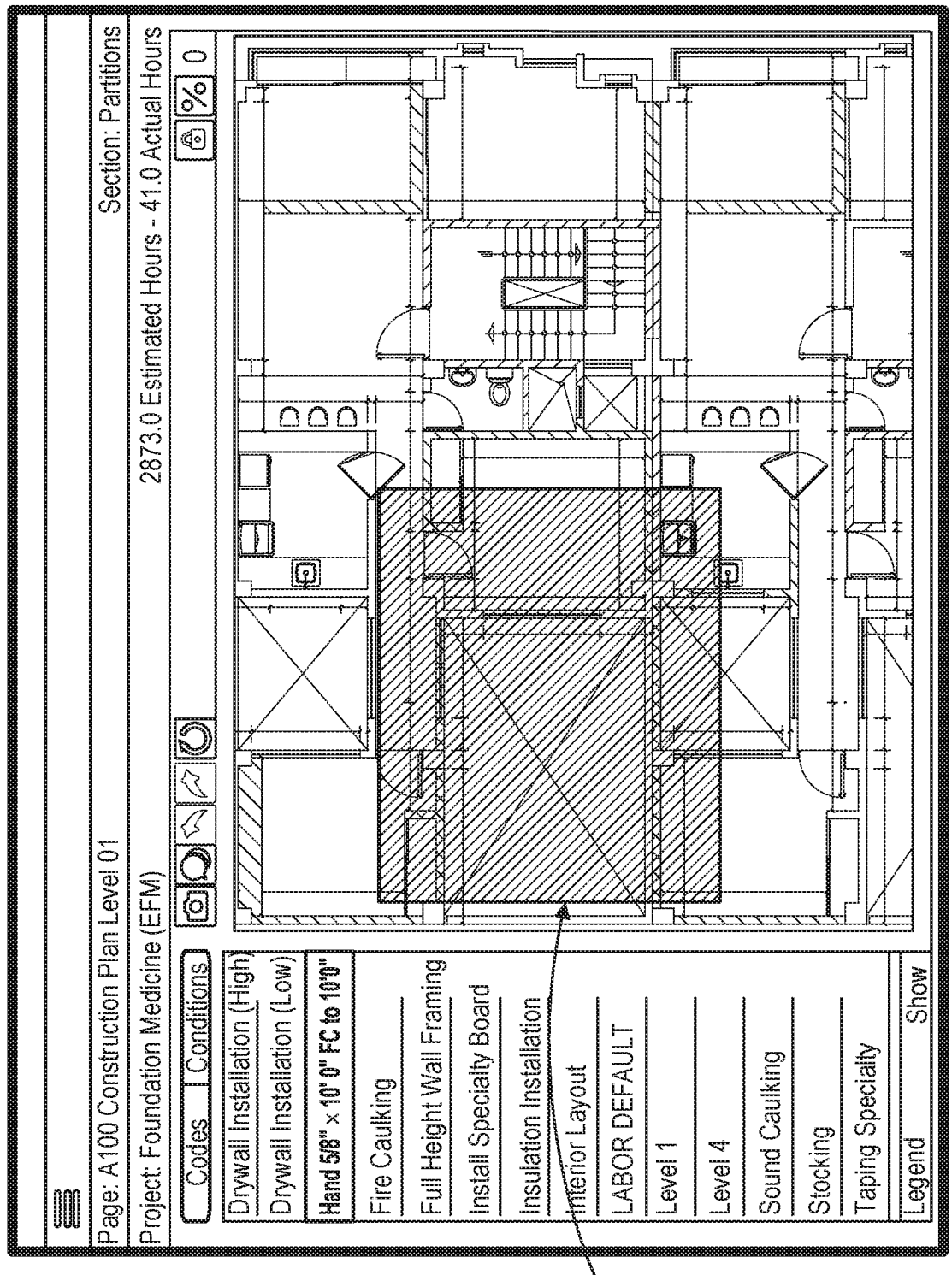
FIG. 2 illustrates an exemplary construction drawing on a user interface, according to one embodiment of the present disclosure.

Turning to FIG. 2, an exemplary construction drawing on a user interface is shown, according to one embodiment of the present disclosure. In various embodiments, once a user has selected a construction drawing 102 to interact with in the user interface, the user may manipulate the screen of the user interface to select one or more shapes. In one or more embodiments, the data visualization system may detect various manipulations (e.g., presses, drags, clicks, translations, etc., by the user on the display screen), and operate accordingly to the various manipulations. In at least one embodiment, the system assigns a specific color (e.g., red) to each shape of the one or more shapes contained within the selection. In some embodiments, a process of selecting one or more shapes via pushing and/or dragging may be referred to as "multi-selecting." For example, in one embodiment, a user may touch a particular shape of the one or more shapes on the user interface, and the system may identify the particular shape. In many embodiments, a user may select more than one shape and shapes in different layers at the same time by manipulating the user interface to draw a box 202 over one or more shapes (e.g., pressing and dragging across the screen), such that the system interprets the interactions as a selection of one or more shapes. For example, in one embodiment, a user may press at a particular point of a construction drawing 102 and drag to a second point of the construction drawing 102, which may cause the system to create a box 202 between the two points. Continuing with the example, in some embodiments, the system may detect all shapes of the one or more shapes that the box 202 covers, and interpret each detected shape as being selected. In many embodiments, after the user manipulates the user interface and the system has detected selected shapes, the user may input work completion information, as described by the description accompanying FIG. 4.

As will be understood, multi-selection may apply to all visualized shapes. For example, if a user is viewing all shapes associated with the labor code "Hand $\frac{5}{8}^{th} \times 10'$ 0" FC to 10' 0''" and multi-selects shapes within a certain area, the system may only select the shapes currently being viewed (e.g., the shapes associated with the labor code "Hand $\frac{5}{8}^{th} \times 10'$ 0" FC to 10' 0''"). According to particular embodiments, if a user is viewing shapes associated with more than one labor code, then multi-selection of shapes may select shapes associated with each of the more than one labor code.

Figure 3:
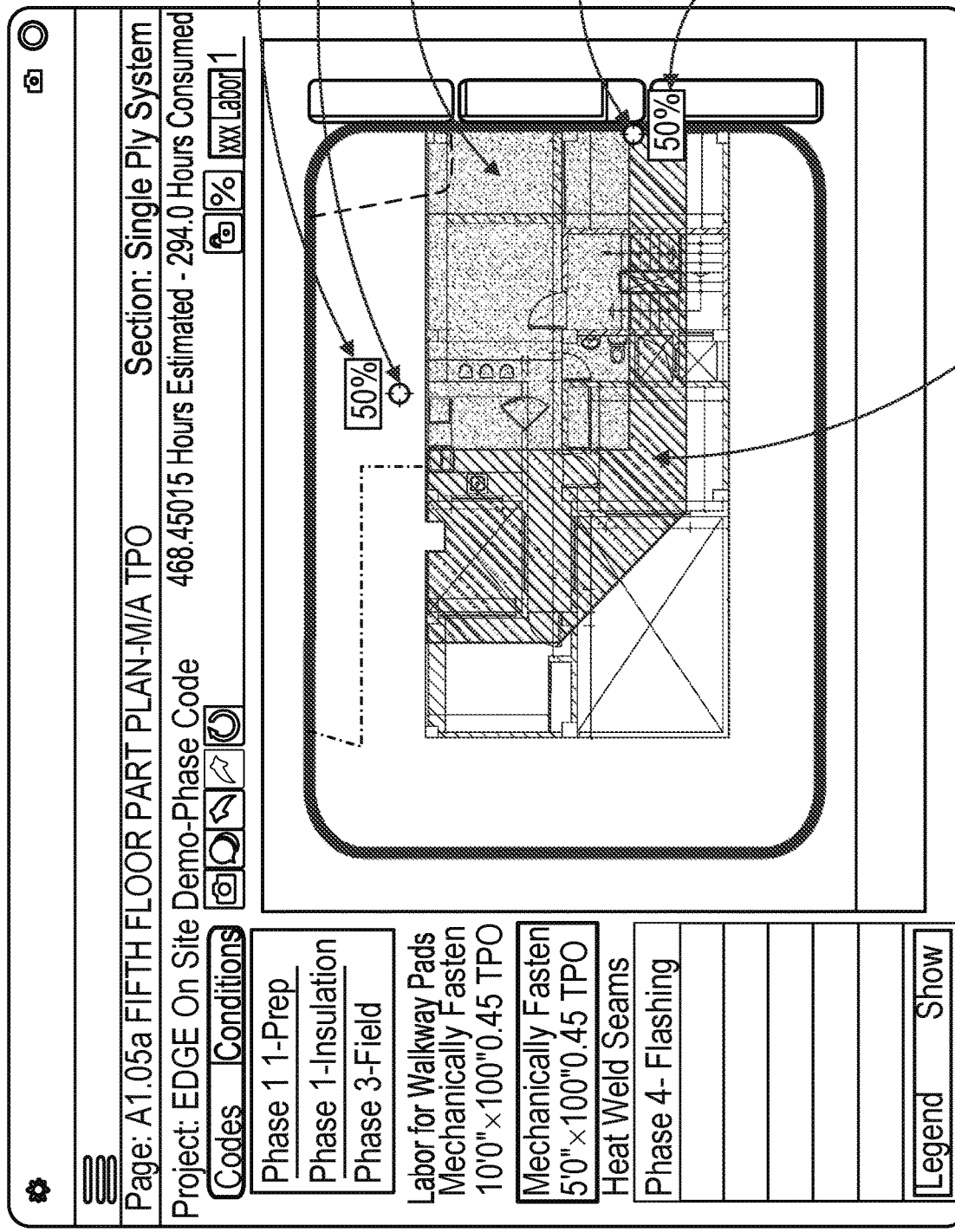
FIG. 3 illustrates an exemplary construction drawing on a user interface, according to one embodiment of the present disclosure.

Turning now to FIG. 3, an exemplary construction drawing on a user interface is shown, according to one embodiment of the present disclosure. In various embodiments, FIG. 3 shows an alternate method of selecting one or more shapes within the construction drawing 102. In one or more embodiments, the system may mark production by detecting a user (e.g., of the data visualization system) pressing a number of times (e.g., twice) on a specific shape of the one or more shapes (e.g., rendered on the electronic device). In at least one embodiment, the system detects (or otherwise receives) the pressing action of the user, turns the specific shape a specific color (e.g., red) and activates a set of crosshairs 302, wherein the set of crosshairs 302 may be overlaid onto the specific shape.

In various embodiments, the data visualization system may detect the manipulation (e.g., drags, translations, etc.) of the set of crosshairs 302, the manipulation directed towards (e.g., as a result of user interaction) identifying a specific area 304 of the specific shape. In one or more embodiments, the data visualization system may detect the specific area 304 of the specific shape and may interpret the specific area 304 contained by the set of cross hairs 302 as complete (e.g., labor may be concluded). In many embodiments, by detecting a selection of one or more shapes, the data visualization system may interpret a corresponding (e.g., underlying) area 304 of the construction drawing 102 as complete (e.g., 100% work completion). In some embodiments, the system may not interpret the specific area 304 contained by the set of cross hairs 302 as complete, but instead may allow a user to input work completion information for the specific shapes within the specific area 304. According to one embodiment, the data visualization system can require an activation input to initiate and render display of the crosshairs 302. In at least one embodiment, the activation input can include, but is not limited to, receiving one or more selections on an input device (such as an electronic device described herein).

In several embodiments, the data visualization system may indicate the specific area and/or line interpreted as complete by assigning the specific area 304 or each shape within the specific area 304 a specific color (e.g., green). In at least one embodiment, each shape of the one or more shapes in a construction drawing 102 may include a completion and/or production value calculated by the system using a predefined scale and a calculated dots per inch (DPI) value (e.g., related to an area of a construction drawing 102 occupied by the shape). In one or more embodiments, marking a particular completion and/or production percentage for a particular shape may cause the system to calculate a completion and/or production metric by computing the particular completion and/or production percentage in relation to a predetermined completion and/or production value. For example, marking a multi-selection of shapes of the one or more shapes as 50% complete may cause the data visualization system to calculate, for each shape in the multi-selection, a completion value (by which to increment a completion metric) that is based on the shape's DPI value contained within the multi-selection. In the same example, the system may determine that 50% of a shape's DPI value is contained within a multi-selection, and may receive a completion and/or production input of 50%. In the same example, the system may compute a completion value of 25% (e.g., equal to a 50% increase in completion of 50% of a shape's area), and may increment the particular shape's current completion and/or production metric by the completion value.

In various embodiments, the data visualization system may automatically assign a completion coloration to one or more shapes contained within the cross hairs 302. In at least one embodiment, the data visualization system may update a completion and/or production value based on the coloration of the one or more shapes. Thus, in one or more embodiments, the system may determine completeness based on a region within the crosshairs and/or a coloration of shapes included therein. For example, in one embodiment, a user may utilize the cross hairs 302 to identify a specific area 304 that contains multiple shapes of the one or more shapes. Continuing with the example, in some embodiments, the user may input a work completion percentage for the multiple shapes of the one or more shapes, and the system may automatically assign the multiple shapes within the specific area 304 a completion coloration (e.g., green) based on the work completion percentage. Still continuing with the example, in many embodiments, the system, based on the work completion percentage, may update the completion and/or production value for each of the multiple shapes. In another example, in one embodiment, the system may automatically assign a 100% completion percentage to any shape identified in a specific area 304 by the cross hairs 302.

In various embodiments, coloring of shapes (e.g., as performed by the data visualization system) to indicate a level of completion pertaining to work occurring within the shapes of the construction drawing 102 may be referred to as "completion coloring assignment." In one or more embodiments, a completion coloring assignment pertaining to a shape, line, and/or a specific region of the shape and/or line may increase as completion of work occurring within the shape, line, and/or the specific region of the shape and/or line increases. In at least one embodiment, completion coloring assignment may be indicated by red and green colorings of one or more specific regions of a shape and/or line, wherein red coloring assignment may indicate uncompleted work, as denoted by area 306 in FIG. 3 and green coloring assignment may indicate completed work, as indicated by area 304 of FIG. 3 (e.g., an increase in percent completion may increase green coloring assignment). In various embodiments, the system displays one or more percent completion values 308 adjacent to the set of crosshairs 302, wherein the one or more percent completion values 308 may correspond with the specific area 304 contained within the set of crosshairs 302 (e.g., a selection being marked complete and colored green). For example, in one embodiment, a user may utilize the crosshairs 302 to select 50% of the one or more shapes on the construction drawing 102, which may be indicated by the one or more percent completion values 308. Continuing with the example, in some embodiments, the system may assign the completion coloration to the shapes within area contained within the set of crosshairs 302.

According to one embodiment, the data visualization system may associate each shape of the one or more shapes with particular metadata associated (or may modify such metadata as received by the system), such as, for example, a dimension value or other metric. For example, a particular shape may include data indicating a dimension value of 100 linear feet (LF). In at least one embodiment, the system may interpret a shape's completion metric as a function of the dimension associated therewith. For example, the data visualization system may interpret, for a shape with associated dimension value 100 LF, a completion metric of 50% as a dimension value of about 50 LF. According to one embodiment, the data visualization system can perform shape coloration processes based on processing completion metrics with corresponding dimension values. For example, the data visualization system can receive, for a particular shape, a completion metric of 50% and generate a dimension value 50 LF based on processing the completion metric with an associated initial dimensional value 100 LF. In the same example, the system may use the generated dimension value as an input to a coloration process and color 50 LF of the particular shape with a green completion coloration. According to one embodiment, the data visualization system can process a plurality of completion metrics with a plurality of corresponding dimension values to perform coloration processes on a plurality of shapes associated with the completion metrics and dimension values.

Figure 4:
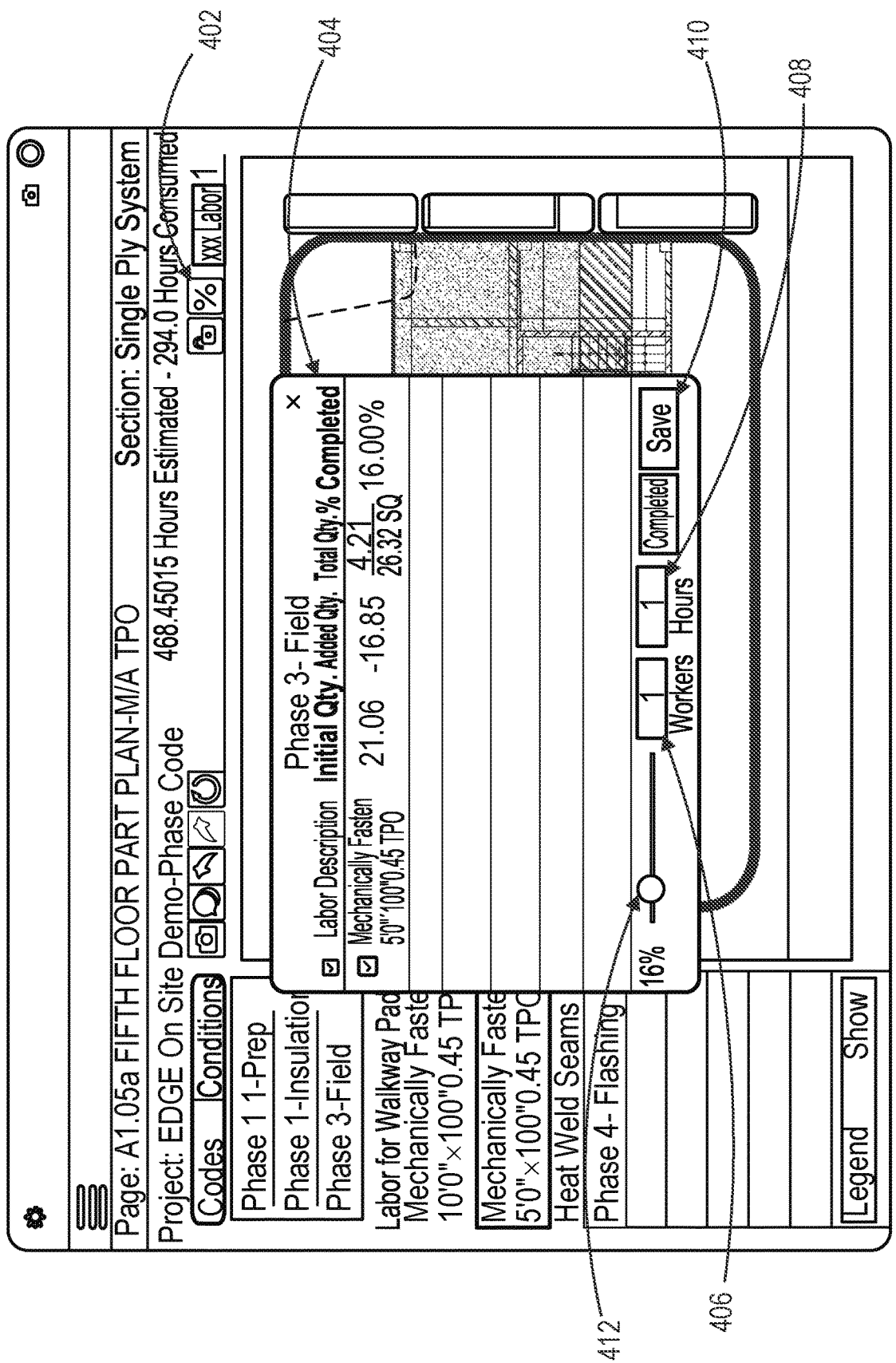
FIG. 4 illustrates an exemplary pop-up window for inputting an amount of work completed on a user interface, according to one embodiment of the present disclosure.

Turning now to FIG. 4, an exemplary percentage dialogue window for inputting an amount of work completed on a user interface is shown, according to one embodiment of the present disclosure. In multiple embodiments, following the selection of one or more shapes by the user, the data visualization system receives a selection (e.g., by a user via the electronic device) of a percent button 402. In one or more embodiments, the percent button 402, when selected, causes the system to launch a percentage dialogue window 404 pertaining to the specific selected shapes.

In at least one embodiment, the percentage dialogue window 404 may contain a workers data field 406 corresponding to a number of workers conducting labor activity in the specific area and/or line, and may contain an hours worked data field 408 corresponding to hours worked (e.g., per worker) in completion of a labor activity in the specific area and/or line. In at least one embodiment, hours worked may be weighted based on a size of a shape (e.g., a completed shape). In one or more embodiments, the data visualization system stores completion data and completion data changes, and updates one or more databases. In various embodiments, the one or more databases may include, but are not limited to: 1) local databases of the electronic device; 2) distributed databases, such as cloud and other virtual databases; and 3) one or more databases shared by the data visualization system and an additional construction estimation system.

In multiple embodiments, the data visualization system may also produce, in the percent dialog window 404, a percent slider 412. In various embodiments, the system receives a manipulation of the percent slider 412 (e.g., by the user), wherein the data visualization system interprets a position of the percent slider 412 and assigns a corresponding percent completion corresponding to the one or more shapes contained within the selection. In one or more embodiments, each shape in a multi-selection may include an initial completion and/or production value (e.g., a predefined completion and/or production value included in the shape upon importation into the data visualization system). In at least one embodiment, to assign a completion percentage to each shape in a multi-selection, the system may increment each shape's completion and/or production value by a metric calculated by processing the completion percentage with respect to each shape's initial completion and/or production value. In various embodiments, a completion percentage inputted via the percent slider 412 for a multi-selection of shapes may be distributed equally across shapes included therein, or may be distributed according to one or more predefined relations between shapes therein, between tasks therein, and/or other relations. In one embodiment, percent completion may refer to the amount of work completed and/or an amount of material used, and may be visualized by the coloring of a number of completed squares, areas, and/or lines (e.g., as measured in square and/or linear feet) out of a total number of squares, areas, and/or lines included in a selection of one or more shapes (e.g., the system may color a portion of a shape based on the percent completion input to indicate that some work has been done on the shape). In one or more embodiments, if a user utilizes the cross hairs 302 to select one or more shapes and the system automatically interprets the selected one or more shapes contained within the specific area 304 by the cross hairs 302 as complete (e.g., 100% work completion), the system may automatically color the selected one or more shapes the completion color (e.g., green).

In one or more embodiments, the system may update the percent dialog window 404, wherein the updated percent dialog window 404 may include, but is not limited to, one or more values based on a percent completion estimate (e.g., as obtained by the data visualization system via the percent slider 412). In various embodiments, the one or more values correspond to the partially and/or completed one or more shapes contained within the selection. In at least one embodiment, the one or more values based on the percent completion estimate may include, but are not limited to: 1) linear feet (LF) of the partially and/or fully completed one or more shapes contained within the selection; 2) square feet (SF) of the partially and/or fully completed one or more shapes contained within the selection; and 3) each account (EA) value of the partially and/or fully completed one or more shapes contained within the selection.

In various embodiments, the percent dialog window 404 may include a save button 410 (e.g., generated by the data visualization system). In one or more embodiments, the system detects selection of the save button 410 (e.g., by a user), wherein selection may occur, for example, following manipulation of the percent slider 412 and entry of values into the worker data fields. In at least one embodiment, the data visualization system detects selection of the save button 410 and may take actions including, but not limited to: 1) saving data pertaining to completion (e.g., position of the completion slider, values of the of worker data fields, etc.); 2) displaying a percent completion estimate on the one or more shapes contained within the selection; 3) updating completion coloring assignment of the one or more partially and/or fully completed shapes contained within the selection; 4) uploading, via an API, the updated construction drawing 102 and the associated one or more shapes to a storage database (e.g., a cloud or physical database); 5) updating construction drawing 102 and shape displays of one or more other electronic devices that are accessing the construction drawing 102 and the associated one or more shapes.

Turning now to FIG. 5, an exemplary daily production report on a user interface is shown, according to one embodiment of the present disclosure. In various embodiments, the system may create a daily production report 502 automatically at a certain time each day during construction, or a user may cause the system to create a daily production report 502 at any point in time. In one or more embodiments, if a user causes the system to create a daily production report 502, the daily production report may include work completed from the start of work that day until the time point the user caused the system to create the daily production report 502. In at least one embodiment, the system may automatically cause the daily production report 502, or a link to the daily production report 502 to be sent, via email, text message, or similar communication methods, to one or more users.

In multiple embodiments, the daily production report 502 may include information regarding each labor item performed during the preceding work day. In many embodiments, information regarding each labor item may include descriptions of the work performed, a labor item detail or number, an amount of workers that performed the work, the weighted hours and total hours, selected quantity of work completed, and a total quantity of work needed to complete the work. For example, in one embodiment, as shown in FIG. 5, the first line item description is "Drywall Installation (Low)" and corresponds to a labor item of "Hang ⅝"×10'0" FC to 10'0"", and shows that one worker performed the specific work for one hour, and that the worker completed 957.59 square feet of work out of the 1473.21 square feet total work. Stated differently, in some embodiments, the worker completed 65% of the work for that labor item (957.59/1473.21) over one hour.

In various embodiments, the system may weigh the worked hours and selected quantity of work for one or more shapes in a multi-selection of shapes so that the work and quantity of work done distribution is determined based on the total amount of work to complete the work for each shape in the multi-selection (work for a shape may include labor, materials, etc.). For example, in one embodiment, a first shape may have a total amount of 100 square feet to be built and a second shape may have a total amount of 200 square feet to be built. Continuing with this example, in some embodiments, if a user inputs that the first shape and the second shape are 40% complete (e.g., in a multi-selection), the system may calculate that the first shape has 40 square feet built and the second shape has 80 square feet built. In multiple embodiments, if the first shape and the second shape are in the same layer (e.g., same labor code), the system may allot two-thirds of the time the work took to the second shape because two-thirds of the total work done was done on the second shape (80 square feet/120 square feet) In many embodiments, weighting of hours worked may be performed by the data visualization system. In one or more embodiments, weighting of hours may further include distribution of weighted hours between one or more shapes of a multi-selection, wherein distribution may be defined by a size of each of the one or more shapes and/or one or more other distribution protocols. In at least one embodiment, one or more reference values (e.g., labor item estimations, proportions, distributions, etc.) used for weighting activities, or other activities, may be pre-defined a disparate system and may be imported by the present system. In some embodiments, a pre-defined weighting system may include dividing time worked evenly between each shape worked on (e.g., for six shapes worked on in one hour, each shape being allotted ten minutes of work) rather than weighting by amount of work to be completed for each shape. In another embodiment, a pre-defined weighting system may include prioritizing particular shapes over other shapes when weighing work completion.

For example, in one embodiment, in FIG. 5, a user may have multi-selected shapes associated with the items indicated in the second and third line items (both labeled "Drywall Installation High"), and input that one worker worked one hour and completed 35% of the work in the percent dialogue window 404. In multiple embodiments, the system weighs the hours worked and quantity of work done by first assessing 35% of the total quantity of work and assigning that number to the selected quantity (for example, for the second line item, 35% of 106.26 is 37.19 square feet, as indicated in the selected quantity column). In many embodiments, once the system determines the weighted selected quantity for each labor item (line items 2 and 3 in this case), the system may add the selected quantities together to get a total amount worked for the one hour worked, and divide each selected quantity by the total amount worked to determine the amount of hours worked. Continuing with this example, as shown in FIG. 5, the total amount worked over the one hour is 142.33 square feet (37.19+105.14). Still continuing with the example, the second labor item (second line item) had a weighted selected quantity worked of 37.19 square feet, so the total hours worked on the second labor item is 0.26 hours (37.19 square feet/142.33 square feet per hour).

Additionally, in multiple embodiments, the data visualization system may utilize an hours estimate for each shape selected within a multi-selection to weigh the inputted worked hours for each shape. In at least one embodiment, the data associations and/or metadata for each shape may include the hours estimate for the shape, which is an estimate of the hours needed to build the shape. In one or more embodiments, for a multi-selection of shapes, the data visualization system may multiply the completion percentage for a shape within the multi-selection by the hours estimate for the shape to determine a weight number for the shape. For example, in one embodiment, a user may input a 20% completion percentage for a particular shape within a multi-selection of shapes, and the particular shape may be assigned a two-hour work estimate. Continuing with the example, in some embodiments, the system may determine that the weight number for the particular shape is 0.4 (20% of the 2-hour estimate). In many embodiments, once the data visualization system has determined the weight number for each shape in the multi-selection of shapes, the system may determine the weighted hours for a particular shape within the multi-selection of shapes by determining the ratio of the weight number for the particular shape to the total sum of the weight numbers for each shape within the multi-selection, and then multiplying the ratio by the inputted hours for the multi-selection of shapes.

For example, in one embodiment, a user may select shape A, shape B, and shape C in a multi-selection and input a total time worked of 5 hours for the multi-selection, such that shape A, shape B, and shape C may be in the same or different labor codes or layers within the construction drawing 102. Continuing with the example, in many embodiments, shape A may have a 30% completion percentage (as inputted by the user) and a three-hour estimate (from the data associations or metadata associated with shape A), shape B may have a 50% completion percentage and a two-hour estimate, and shape C may have a 25% completion percentage and a six-hour estimate. Continuing with the example, in some embodiments, the weight number for shape A is 0.9 (30% of 3 hour estimate), the weight number for shape B is 1 (50% of 2 hour estimate), and the weight number for shape C is 1.5 (25% of 6 hour estimate). Still continuing with the example, in several embodiments, the system may determine the weighted hours for each shape by determining the total sum of the weight numbers for all the shapes within the multi-selection (in this example, 0.9+1+1.5=3.4), and determining the ratio of the weighted number for each shape over the total sum of weighted numbers and multiplying the ratio by the hours input by the user. Still continuing with the example, in multiple embodiments, the weighted hours for shape A is about 1.32 hours ((0.9 shape A weight number/3.4 total sum of weighted numbers)×5 hours=1.32 hours), the weighted hours for shape B is about 1.47 hours, and the weighted hours for shape C is about 2.21 hours. In at least one embodiment, the system may display the weighted hours on generated reports, such as the daily production report 502.

Figure 6:
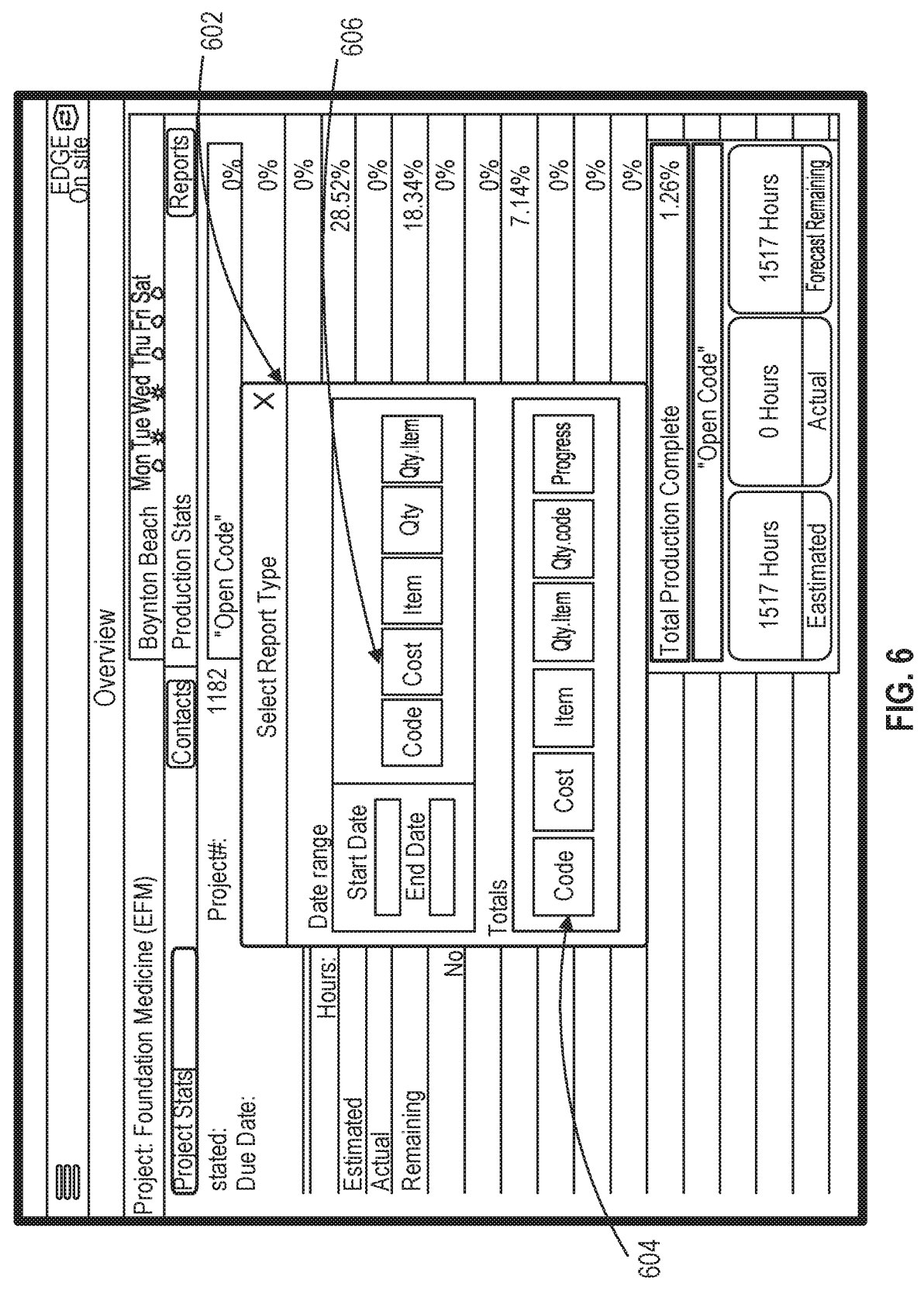

Turning now to FIG. 6, an exemplary window for selecting report types user interface is shown, according to one embodiment of the present disclosure. In various embodiments, the data visualization system may generate various report types from which a user may select to view and/or to transmit to one or more other users. In at least one embodiment, the data visualization system receives a selection (e.g., by a user via the electronic device) of a report button, and may open a report type window 602 that displays the various report types the user may view. In one or more embodiments, types of reports may include, but are not limited to, code reports (discussed below in reference to FIG. 7), cost reports (discussed below in reference to FIG. 8), item reports, quantity reports, quantity item reports, quantity code reports, and progress reports.

Figure 7:
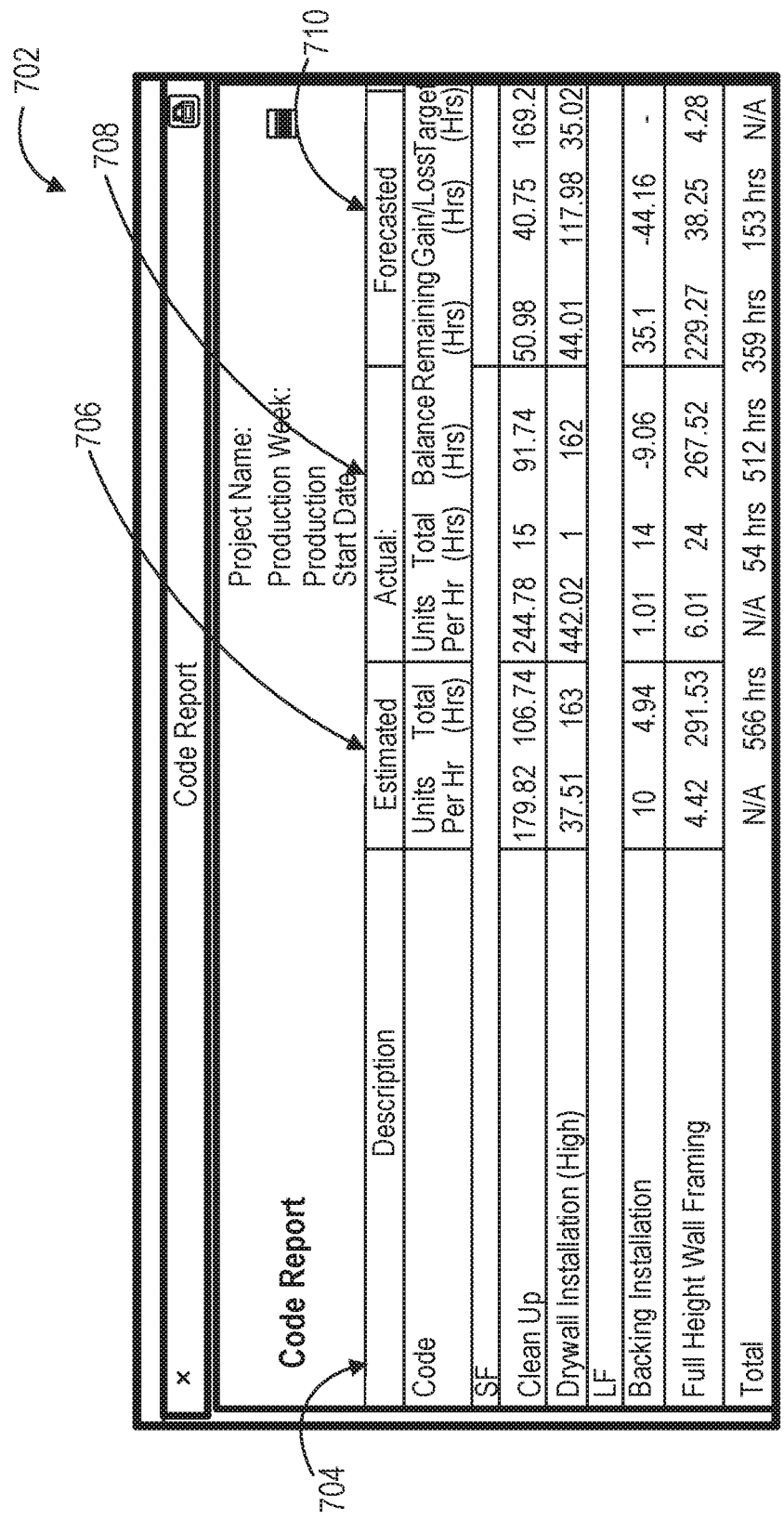
FIG. 7 illustrates an exemplary code report on a user interface, according to one embodiment of the present disclosure.

Turning now to FIG. 7, an exemplary code report user interface is shown, according to one embodiment of the present disclosure. In several embodiments, the system may detect selection of the "Code" report button 604 located on the report type window 602 (see FIG. 6). In one or more embodiments, the system may generate the code report 702. In at least one embodiment, the code report 702 may include labor item codes 704 and various project information associated with the codes. In one embodiment, the system may receive an input that indicates estimated project information 706 for each code, and based on the actual project data 708 received by the system throughout the project, the system may generate forecasted project information 710 related to amount of hours forecasted to complete the work for each code.

Figure 8:
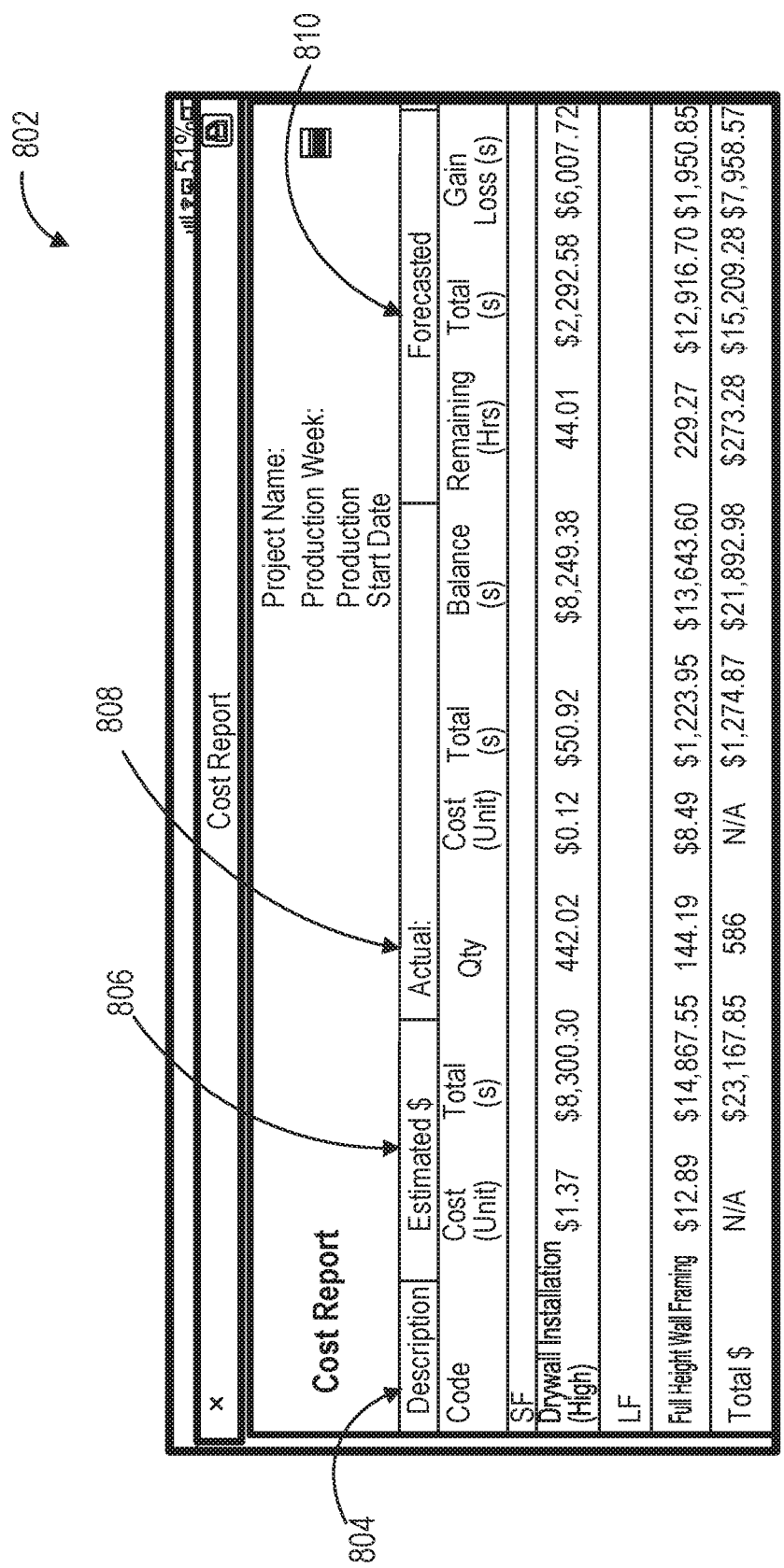
FIG. 8 illustrates an exemplary cost report on a user interface, according to one embodiment of the present disclosure.

Turning now to FIG. 8, an exemplary cost report user interface is shown, according to one embodiment of the present disclosure. In at least one embodiment, the system may detect selection of the "Cost" report button 606 located on the report type window 602 (see FIG. 6). In many embodiments, the system may generate the cost report 802. In one or more embodiments, the cost report 802 may include labor item codes 804 and various project cost information associated with the codes. In some embodiments, the system may receive an input that indicates estimated project cost information 806 for each code, and based on the actual project data 808 received by the system during the project, the system may generate forecasted project cost information 810 for each code.

Figure 9:
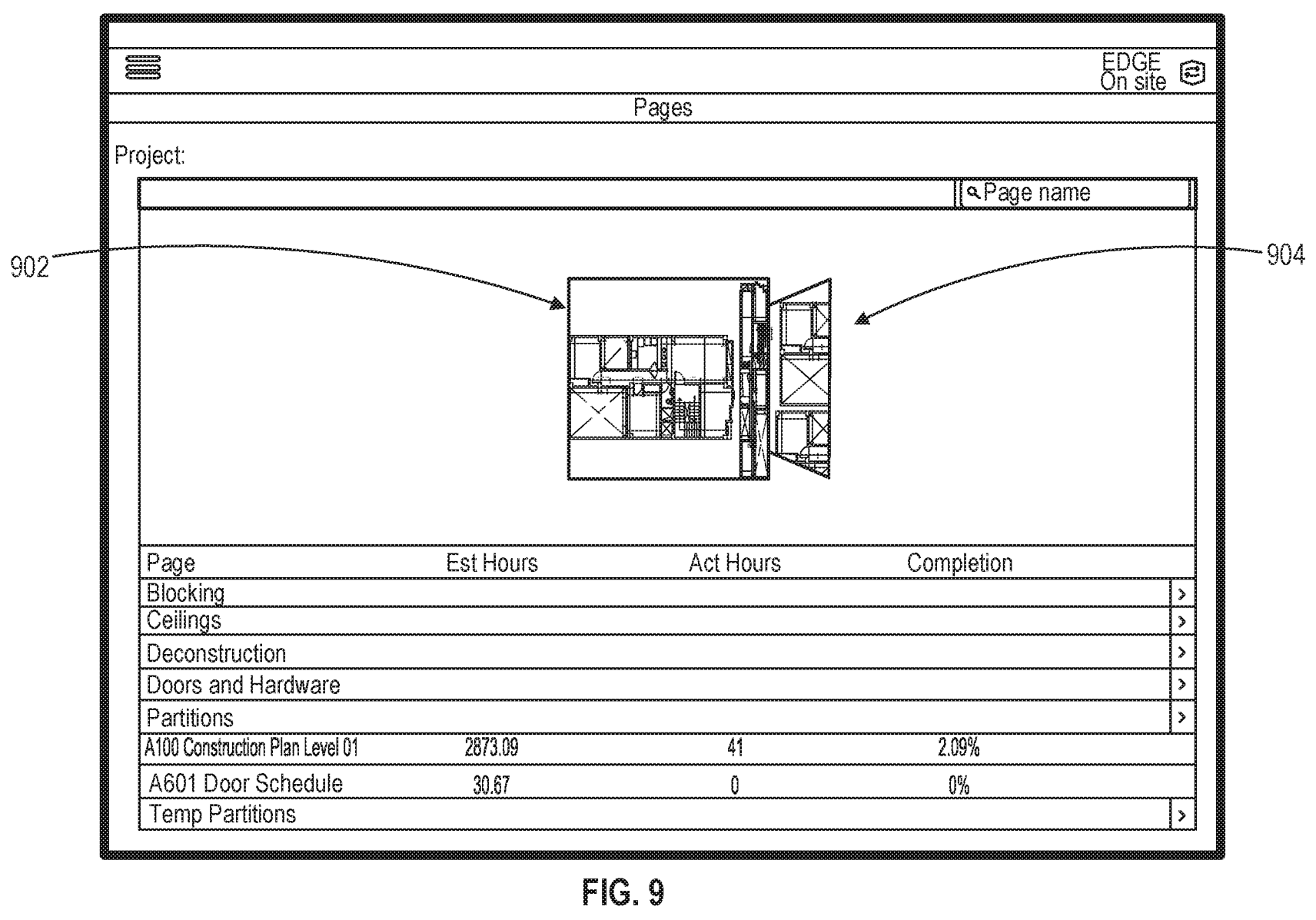

Turning now to FIG. 9, an exemplary construction drawing selection page on a user interface is shown, according to one embodiment of the present disclosure. In at least one embodiment, the construction drawing 102 may be selected from a set of construction drawings, wherein the set of construction drawings is displayed by the data visualization system as a carousel 902 including one or more construction drawings (e.g., pertaining to the project). In several embodiments, the carousel 902 includes thumbnail images of each imported construction drawing 904. In one or more embodiments, the system transforms the full-sized construction drawings into thumbnail images 904, which are reduced-size versions of the construction drawings.

In multiple embodiments, the system may create a thumbnail image from a construction drawing upon receiving the construction drawing. In one embodiment, the system may create the thumbnail image by making a copy of the construction drawing and proportionally reducing the size of the drawing.

In various embodiments, the data visualization system may include one or more image insertion buttons. In one or more embodiments, the data visualization system detects or receives a selection (e.g., by a user) of the one or more image buttons, wherein each of the one or more image buttons may correspond to at least one specific shape and/or task featured on a construction drawing. In at least one embodiment, the data visualization system may generate a window configured to facilitate functions including, but not limited to, image capture, image importation and image upload. In some embodiments, the image capture function may be achieved by the data visualization system, in part, through engaging a camera operatively coupled to the electronic device, capturing a photograph, and receiving the captured photograph (e.g., the image). In various embodiments, the data visualization system may present captured images and/or previously imported images as one or more options to a user, whereupon the data visualization system detects an image selection inputted by the user. In one or more embodiments, a selected image may be inserted into or otherwise associated with (e.g., in memory) the construction drawing or selected one or more shapes, wherein the data visualization system may associate the inserted image with a specific shape and/or other element of a construction drawing of a project. In at least one embodiment, the data visualization system saves the selected image and updates construction drawing. In one or more embodiments, the data visualization system, prior to inserting the selected image, may generate an image editing window, wherein the image editing window may allow performance of editing and/or commenting (e.g., by the user) on the selected image.

In various embodiments, the data visualization system, via the electronic device, may automatically and/or manually (e.g., as triggered by a user) upload, via an API, one or more project visualizations and other project data to a storage database, wherein the one or more visualizations and project data may be accessible to the user through a web portal. In at least one embodiment, the data visualization system performs uploading using web calls (e.g., for example, web calls in JSON format over HTTPS protocol). In one or more embodiments, the web portal may include each and every element of the data visualization system as presented on the electronic device. In at least one embodiment, the data visualization system, both on the electronic device and through the web portal, may perform one or more additional actions. In various embodiments, the one or more actions include, but are not limited to: 1) establishment and/or delivery of one or more specific notifications, such as a notification delivered when a specific completion percentage is reached (e.g., in a project and/or subset thereof); 2) generation and delivery of one or more specific reports, wherein the report may comprise project data and/or project visualizations; and 3) querying of weather data from one or more sources, wherein completion estimates (e.g., completion forecasts) may be adjusted according to one or more specific values of the queried weather data.

Figure 10:
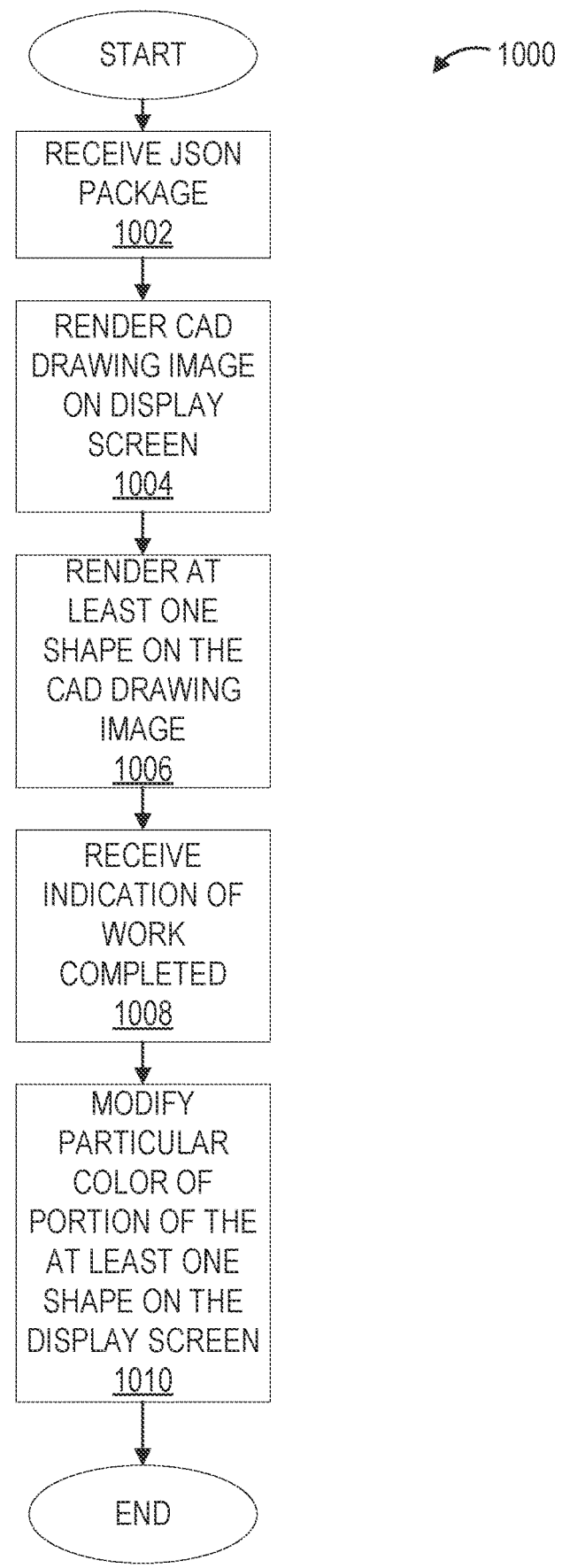
FIG. 10 is a flowchart of an exemplary data visualization process, according to one embodiment of the present disclosure.

As shown in FIG. 10, an exemplary data visualization process 1000 is described, according to one embodiment of the present disclosure. In one or more embodiments, the data visualization process 1000 may operate on a downloadable software application (e.g., a mobile application) or non-downloadable software application (e.g., a web-based portal). In some embodiments, the downloadable software application or non-downloadable software application may be operated on a computing device, such as a personal computer, laptop, mobile device, tablet, or other similar devices.

In various embodiments, at step 1002, after a user has downloaded the software application or accessed the non-downloadable software application via a computing device, the data visualization system may receive or import data (e.g., an electronic file or data package) from one or more data sources and/or one or more other systems containing project information. In many embodiments, the data imported (e.g., an electronic file or data package) may be in the range of about 200 kilobytes to 5 megabytes (or any suitable size). As will be understood from discussions herein, the file size of the data package is much smaller than that of a full-sized construction drawing file, allowing for display and manipulation of the reduced size (e.g., image) construction drawing on a tablet or other computing device.

In at least one embodiment, the imported data may be in any suitable format. In at least on embodiment, the imported data is in the form of a JSON package.

As will be understood from discussions herein, data included in the data package may be at least partially based on data is in the form of BIM files (.bim), Revit files (.rvt), CAD files, and other file formats utilized in connection with architectural plans, blue prints, and other similar project plans. In at least one embodiment, the system may convert or compress, at a server, the imported data into a file format that is compatible with being used on a mobile device or tablet (e.g., PNG/TIF formatting) because these devices may not have processing or data storage capacity to efficiently process large electronic files. For example, in one or more embodiments, the system may receive a CAD construction drawing file, and the system may convert the CAD construction drawing file into an image of the CAD construction drawing at a server, and then transmit the image of the CAD construction drawing and associated data to the computing device.

As will be understood from discussions herein, the imported data may include various construction drawing, shape, and layer data, along with other metadata. In one or more embodiments, the imported data may include one or more construction drawings 102, one or more shapes, data associations between the one or more construction drawings 102 and the one or more shapes, and metadata associated with the one or more shapes that correspond to one or more properties of the one or more shapes. In some embodiments, the data associations and metadata may include, but are not limited to, labor data, cost data, materials data, project estimation data, data for processing labor, cost, and materials calculations for the project, and other similar data.

Additionally, in many embodiments, the data associations may also include location information for each shape of the one or more shapes associated with a particular location on the construction drawing 102. In one embodiment, location information may include x-y coordinate information associated with a particular location of a particular shape on a particular construction drawing 102 (e.g., the location of the shape on the construction drawing). In at least one embodiment, the one or more shapes may define x-y coordinate information for the construction drawing 102 such that the system may accurately place the one or more shapes associated with the construction drawing 102 onto the (image of the) construction drawing 102. For example, in one embodiment, the data associations may define a corner of the construction drawing 102 as point '0,0' on an x-y plot, such that the x-axis and y-axis of the x-y plot are two edges of the construction drawing 102 and each shape of the one or more shapes that defines the construction drawing 102 has at least one x-y coordinate. In some embodiments, a shape of the one or more shapes may include a line or an area such that the x-y coordinate information includes multiple x-y coordinates. In one or more embodiments, the multiple x-y coordinates for each shape of the one or more shapes that are a line or an area may be the perimeter of the line or area that formulates each shape of the one or more shapes, such that the system may determine that a point within the enclosed perimeter of a particular shape is associated with the particular shape. In at least one embodiment, the x-y coordinate information for a particular shape may include every x-y coordinate of the line or area of the particular shape.

In multiple embodiments, at step 1004, the data visualization system may render the construction drawing 102 onto a display screen in the user interface. In various embodiments, the system renders the construction drawing 102 by converting the construction drawing into one or more image files and displaying the construction drawing 102 on a user interface. In some embodiments, the system may scale, rotate, or add a coordinate system to the construction drawing 102 upon rendering on the user interface. In one or more embodiments, the imported data may include x-y coordinate information for the construction drawing 102, such that when the system displays the construction drawing 102, the construction drawing includes the x-y coordinate system. In at least one embodiment, the user may have previously selected a particular construction drawing 102 from one or more construction drawings 102 received by the system.

In several embodiments, at step 1006, the data visualization system may render one or more shapes onto the construction drawing 102 on the display screen of the user interface. In some embodiments, the system may render each of the one or more shapes at a particular location on the construction drawings 102 based on the received location information for each of the one or more shapes. In one or more embodiments, the location information for a particular shape may include x-y coordinates that correspond to a location on the construction drawing 102. In at least one embodiment, the data visualization system may also render each of the one or more shapes in a particular color, based on the location information and other association information and metadata corresponding to each shape of the one or more shapes.

In many embodiments, the system may color in a shape based on the perimeter of the shape (as defined by the x-y coordinates associated with the shape). In various embodiments, the system may, in addition to utilizing the x-y coordinate information, utilize shape size information (e.g., height, length, and/or width of the shape) to color the shape.

For example, in one embodiment, a particular shape of the one or more shapes may correspond or be associated with metadata for a particular labor item and/or labor code (e.g., a particular layer) and a first location, and the system may render the particular shape a particular color (e.g., blue) based on the labor item and/or labor code, and may assign all shapes associated with the particular labor item and/or labor code the same particular color. Continuing with the example, in multiple embodiments, a second shape of the one or more shapes may correspond to or be associated with a second location and a second labor item and/or labor code, and the system may render the second particular shape in a second particular color (e.g., orange). In one or more embodiments, if the second location is different from the first location, the second particular color assigned by the system to the second shape may be different than the particular color assigned to the particular shape. Still continuing with the example, in many embodiments, if the second location is the same as the first location (e.g., same x-y coordinates) the system may assign the particular shape and the second shape a third particular color (e.g., dark blue) for when the particular shape and the second shape are displayed at the same time. In this example, the third particular color represents that two or more shapes are located at the particular location (e.g., multi-layered shapes) on the construction drawing 102.

In various embodiments, at step 1008, the data visualization system may receive an indication of work completed for one or more shapes rendered on the construction drawing 102. In one or more embodiments, a user may utilize the user interface tools (e.g., cross hairs 302 or the percent dialogue window 404) to select at least one shape of the one or more shapes (as described herein). In at least one embodiment, the system may determine that at least one shape of the one or more shapes is selected, and may thereafter receive a work completed input regarding an amount of work completed, a number of hours worked, and/or a number of workers that performed the work.

In many embodiments, upon receiving the work completed input, the system may utilize one or more APIs to transmit the work completed input to one or more servers that determine updated project information, such as but not limited to, quantities of work completed and work remaining (in measurements and percentages), cost of work completed, and update forecasted budgets for the project, including labor, materials, and cost budgets, and to transmit the updated project information back to the system.

In several embodiments, at step 1010, upon determining the percent of work completed for a particular shape, the data visualization system may modify the particular color of a portion of the particular shape. For example, in one embodiment, the system may determine that 40% of the work is completed for a particular shape, and may modify the color of the particular shape so that 40% of the particular shape is the completion color (e.g., green) and the remaining 60% of the particular shape is a particular color assigned by the system at step 1006 (e.g., orange).

Figure 11:
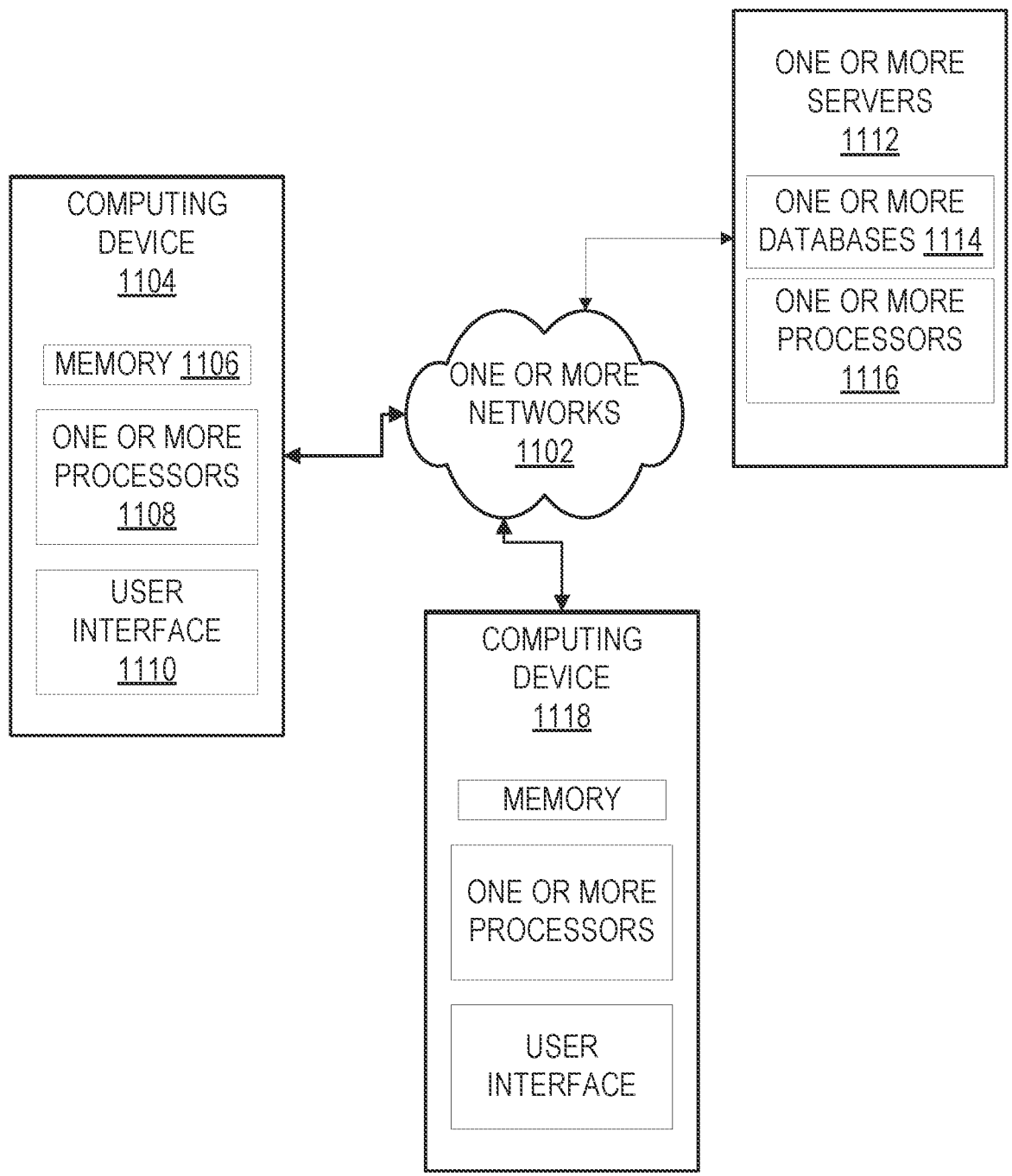
FIG. 11 is a diagram of an exemplary data visualization system network architecture, according to one embodiment of the present disclosure.

Turning to FIG. 11, an architecture diagram of an exemplary data visualization system 1100 is shown, according to one embodiment of the present disclosure. In various embodiments, the data visualization system 1100 may include one or more networks 1102 that connect at least one computing device 1104 to one or more servers 1112. In at least one embodiment, the at least one computing device 1104 may be a personal computer, a laptop, a tablet, a mobile device, or any other similar device. In one embodiment, the at least one computing device 1104 may be the computing device used by a user on a construction site to input work completion information into the system and to track the work of a project.

In many embodiments, the at least one computing device 1104 may include memory 1106, one or more processors 1108, and a user interface 1110. In some embodiments, the one or more servers 1112 may include one or more databases 1114 for storing information, and one or more processors 1116. In one embodiment, the one or more servers may be cloud-computing servers.

In multiple embodiments, the data visualization system 1100 may include a second computing device 1118 that is connected to the at least one computing device 1104 and the one or more servers 1112. In one or more embodiments, the second computing device 1118 may be a personal computer, a laptop, a tablet, a mobile device, or any other similar device. In some embodiments, the second computing device 1118 may be a computing device used by a user off-site to keep track of the progress of the project (e.g., a project manager at an office getting updates from the site). In one embodiment, a user may cause the at least one computing device 1104 to send project updates to the second computing device 1118 via the one or more networks 1102.

From the foregoing, it will be understood that various aspects of the processes described herein are software processes that execute on computer systems that form parts of the system. Accordingly, it will be understood that various embodiments of the system described herein are generally implemented as specially-configured computers including various computer hardware components and, in many cases, significant additional features as compared to conventional or known computers, processes, or the like, as discussed in greater detail herein. Embodiments within the scope of the present disclosure also include computer-readable media for carrying or having computer-executable instructions or data structures stored thereon. Such computer-readable media can be any available media which can be accessed by a computer, or downloadable through communication networks. By way of example, and not limitation, such computer-readable media can comprise various forms of data storage devices or media such as RAM, ROM, flash memory, EEPROM, CD-ROM, DVD, or other optical disk storage, magnetic disk storage, solid state drives (SSDs) or other data storage devices, any type of removable non-volatile memories such as secure digital (SD), flash memory, memory stick, etc., or any other medium which can be used to carry or store computer program code in the form of computer-executable instructions or data structures and which can be accessed by a computer.

When information is transferred or provided over a network or another communications connection (either hardwired, wireless, or a combination of hardwired or wireless) to a computer, the computer properly views the connection as a computer-readable medium. Thus, any such a connection is properly termed and considered a computer-readable medium. Combinations of the above should also be included within the scope of computer-readable media. Computer-executable instructions comprise, for example, instructions and data which cause a computer to perform one specific function or a group of functions.

Those skilled in the art will understand the features and aspects of a suitable computing environment in which aspects of the disclosure may be implemented. Although not required, some of the embodiments of the claimed inventions may be described in the context of computer-executable instructions, such as program modules or engines, as described earlier, being executed by computers in networked environments. Such program modules are often reflected and illustrated by flow charts, sequence diagrams, exemplary screen displays, and other techniques used by those skilled in the art to communicate how to make and use such computer program modules. Generally, program modules include routines, programs, functions, objects, components, data structures, application programming interface (API) calls to other computers whether local or remote, etc. that perform particular tasks or implement particular defined data types, within the computer. Computer-executable instructions, associated data structures and/or schemas, and program modules represent examples of the program code for executing steps of the methods disclosed herein. The particular sequence of such executable instructions or associated data structures represent examples of corresponding acts for implementing the functions described in such steps.

Those skilled in the art will also appreciate that the claimed and/or described systems and methods may be practiced in network computing environments with many types of computer system configurations, including personal computers, smartphones, tablets, hand-held devices, multi-processor systems, microprocessor-based or programmable consumer electronics, networked PCs, minicomputers, mainframe computers, and the like. Embodiments of the claimed invention are practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing various aspects of the described operations, which is not illustrated, includes a computing device including a processing unit, a system memory, and a system bus that couples various system components including the system memory to the processing unit. The computer will typically include one or more data storage devices for reading data from and writing data to. The data storage devices provide nonvolatile storage of computer-executable instructions, data structures, program modules, and other data for the computer.

Computer program code that implements the functionality described herein typically comprises one or more program modules that may be stored on a data storage device. This program code, as is known to those skilled in the art, usually includes an operating system, one or more application programs, other program modules, and program data. A user may enter commands and information into the computer through keyboard, touch screen, pointing device, a script containing computer program code written in a scripting language or other input devices (not shown), such as a microphone, etc. These and other input devices are often connected to the processing unit through known electrical, optical, or wireless connections.

The computer that effects many aspects of the described processes will typically operate in a networked environment using logical connections to one or more remote computers or data sources, which are described further below. Remote computers may be another personal computer, a server, a router, a network PC, a peer device or other common network node, and typically include many or all of the elements described above relative to the main computer system in which the inventions are embodied. The logical connections between computers include a local area network (LAN), a wide area network (WAN), virtual networks (WAN or LAN), and wireless LANs (WLAN) that are presented here by way of example and not limitation. Such networking environments are commonplace in office-wide or enterprise-wide computer networks, intranets, and the Internet.

When used in a LAN or WLAN networking environment, a computer system implementing aspects of the invention is connected to the local network through a network interface or adapter. When used in a WAN or WLAN networking environment, the computer may include a modem, a wireless link, or other mechanisms for establishing communications over the wide area network, such as the Internet. In a networked environment, program modules depicted relative to the computer, or portions thereof, may be stored in a remote data storage device. It will be appreciated that the network connections described or shown are exemplary and other mechanisms of establishing communications over wide area networks or the Internet may be used.

While various aspects have been described in the context of a preferred embodiment, additional aspects, features, and methodologies of the claimed inventions will be readily discernible from the description herein, by those of ordinary skill in the art. Many embodiments and adaptations of the disclosure and claimed inventions other than those herein described, as well as many variations, modifications, and equivalent arrangements and methodologies, will be apparent from or reasonably suggested by the disclosure and the foregoing description thereof, without departing from the substance or scope of the claims. Furthermore, any sequence(s) and/or temporal order of steps of various processes described and claimed herein are those considered to be the best mode contemplated for carrying out the claimed inventions. It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in a variety of different sequences and orders, while still falling within the scope of the claimed inventions. In addition, some steps may be carried out simultaneously, contemporaneously, or in synchronization with other steps.

The embodiments were chosen and described in order to explain the principles of the claimed inventions and their practical application so as to enable others skilled in the art to utilize the inventions and various embodiments and with various modifications as are suited to the particular use contemplated. Alternative embodiments will become apparent to those skilled in the art to which the claimed inventions pertain without departing from their spirit and scope. Accordingly, the scope of the claimed inventions is defined by the appended claims rather than the foregoing description and the exemplary embodiments described therein.

We claim:

1. A process for data visualization comprising:
   receiving a data package comprising:
      at least one shape and x-y coordinate data associated with a particular location of the at least one shape on a CAD drawing; and
      metadata associated with the at least one shape comprising orientation information, boundary location information, corner or line information, or a combination thereof;
   positioning the at least one shape at a particular location on a CAD drawing image based at least in part on (i) the x-y coordinate data and (ii) the metadata associated with the at least one shape;
   rendering the at least one shape at the particular location on the CAD drawing image in a particular color; and
   in response to receiving an indication of work completed associated with the one or more properties of the at least one shape, modifying the particular color of a portion of the at least one shape on a display screen.

2. The process of claim 1, wherein the particular color is associated with a first layer.

3. The process of claim 1, wherein the at least one shape is associated with a first layer.

4. The process claim 1, wherein the data package comprises a second shape associated with a second layer.

5. The process of claim 4, wherein the process further comprises rendering the second shape on the display screen.

6. The process of claim 5, wherein rendering the second shape on the display screen comprises rendering the second shape in a second location on the CAD drawing image based at least in part on second x-y coordinate data.

7. The process of claim 6, wherein the second location on the CAD drawing is the particular location.

8. The process of claim 7, wherein the process further comprises rendering the at least one shape and the second shape in a second color.

9. The process of claim 8, wherein the second color is not the particular color.

10. The process of claim 6, wherein the second location on the CAD drawing is different than the particular location.

11. The process of claim 10, wherein the process further comprises rendering the at least one shape in the particular color and the second shape in a second color.

12. The process of claim 1, wherein the process further comprises receiving a selection of the CAD drawing.

13. The process of claim 1, wherein the one or more properties of the at least one shape comprise an amount of materials.

14. A system for data visualization comprising:
   at least one processor in operative communication with one or more servers, the at least one processor configured for:
      receiving a data package from the one or more servers, the data package comprising:
         at least one shape and x-y coordinate data associated with a particular location of at least one shape one on a CAD drawing; and
         metadata associated with the at least one shape corresponding to one or more properties of the at least one shape, wherein the one or more properties of the at least one shape comprise orientation information, boundary location information, corner or line information, or a combination thereof;
      positioning the at least one shape at a particular location based at least in part on (i) the x-y coordinate data and (ii) the metadata associated with the at least one shape;
      rendering the at least one shape in a particular color on a CAD drawing image; and
      in response to receiving an indication of work completed associated with the one or more properties of the at least one shape, modifying the particular color of a portion of the at least one shape on a display screen.

15. The system of claim 14, wherein the particular color is associated with a first layer.

16. The system of claim 14, wherein the at least one shape is associated with a first layer of the CAD drawing.

17. The system claim 14, wherein the data package comprises a second shape associated with a second layer.

18. The system of claim 17, wherein the at least one processor is further configured for rendering the second shape on the display screen.

19. The system of claim 18, wherein rendering the second shape on the display screen comprises rendering the second shape in a second location on the CAD drawing image based at least in part on second x-y coordinate data.

20. The system of claim 19, wherein:
   the second location on the CAD drawing is the particular location;
   the at least one processor is further configured for rendering the at least one shape and the second shape in a second color; and
   the second color is not the particular color.

* * * * *